(12) United States Patent
Yan et al.

(10) Patent No.: US 6,566,963 B1
(45) Date of Patent: May 20, 2003

(54) TRANSFORMER-BASED LOW NOISE VARIABLE GAIN DRIVER AMPLIFIER

(75) Inventors: Kelvin Kai Tuan Yan, High Point, NC (US); Ashraf Rozek, Greensboro, NC (US); Kihong Kim, Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 10/071,676

(22) Filed: Feb. 7, 2002

(51) Int. Cl.[7] ............................. H03F 3/04; H03G 3/12; H03G 3/10
(52) U.S. Cl. ..................... 330/311; 330/283; 330/285
(58) Field of Search ............................. 330/283, 285, 330/311

(56) References Cited

U.S. PATENT DOCUMENTS

| | | | | |
|---|---|---|---|---|
| 3,801,921 A | * | 4/1974 | Wolf | 330/267 |
| 4,249,202 A | * | 2/1981 | Perry et al. | 348/623 |
| 4,268,797 A | * | 5/1981 | Buck et al. | 330/277 |
| 6,026,286 A | | 2/2000 | Long | 455/327 |
| 6,392,476 B1 | * | 5/2002 | Rodriguez | 330/10 |

OTHER PUBLICATIONS

Long, John R., "A Low–Voltage 5.1–5.8–GHz Image–Reject Downconverter RF IC," IEEE Journal of Solid–State Circuits, vol 35, No. 9, Sep. 2000, pp. 1320–1328.
Zhou, Jianjun J. and Allstot, David J., "Monolithic Transformers and Their Application in a Differential CMOS RF Low–Noise Amplifier," IEEE Journal of Solid–State Circuits, vol. 33, No. 12, Dec. 1998, pp. 2020–2027.

* cited by examiner

Primary Examiner—Patricia T. Nguyen
(74) Attorney, Agent, or Firm—Withrow & Terranova, PLLC

(57) ABSTRACT

An input amplifier stage couples its output power to a second gain stage through a transformer. The transformer coupling allows for the removal of a diode voltage drop at a second gain stage, thereby allowing the collector of the transistor in the second stage to have a larger voltage swing.

24 Claims, 6 Drawing Sheets

TRANSFORMER-BASED LOW NOISE VARIABLE GAIN DRIVER AMPLIFIER

FIELD OF THE INVENTION

The present invention relates to radio frequency amplifiers and particularly relates to a variable gain driver amplifier.

BACKGROUND OF THE INVENTION

Wireless communication systems enjoy significant popularity, finding widespread use in both developed and developing regions. Indeed, the very popularity of wireless communication systems spurs their development and advancement, driving system designers and service providers to devise ways of supporting more users within a finite radio frequency spectrum. Existing and pending wireless communications standards typically rely on frequency, code, or time-division multiplexing techniques that allow multiple users of mobile terminals to share the same frequencies within a given service area. Commonly, such access schemes benefit from each mobile terminal controlling its transmitted signal power to help minimize its interference with other active devices in a given wireless service area.

This power control approach presents mobile terminal designers with significant challenges. For example, power control techniques typically require transmit signal amplifier circuits that provide a range (often continuous) of transmit signal gain. This allows a controlling device (e.g., a cellular telephone) to transmit with a desired signal power based on adjusting the gain of one or more such transmit signal amplifier circuits. For example, as the mobile terminal moves closer to a supporting base station, the wireless communications systems may instruct the mobile terminal, via control signaling, to reduce its transmit power. Essentially, in such wireless communications systems, active mobile terminals are controlled such that they transmit with the minimum necessary signal power at all times.

High fidelity requirements impose further challenges on designers of wireless communications transmitters. Many wireless communications standards impose strict adjacent power limitations—a measure of unwanted signal power appearing in radio channels adjacent to the selected transmit channel. Digital modulation schemes, such as those used in Global System for Mobile communications (GSM) or Personal Communications System (PCS) systems, typically require phase or frequency modulation in combination with amplitude modulation. The need for envelope modulation (amplitude) imposes a requirement for linear amplification of the transmit signal. As noted, this linear amplification must usually support variable gain, so that the linear, radio frequency signal may be gain adjusted to comply with transmit signal output power control requirements.

Thus, modern wireless communication devices typically must meet the dual, sometimes contradictory, requirements of providing flexible transmit signal output power control, while still maintaining acceptable amplification linearity. A number of approaches exist for meeting these design challenges, and include transistor-based amplifier gain stages using differing topologies and differing gain control techniques.

One approach to a transistor amplifier gain stage comprises providing a transistor amplifier having a gain path and a shunt path, with the shunt path having no signal gain. In operation, a current steering mechanism splits current between the gain and shunt paths to provide a desired amount of gain. A "Gilbert" cell represents such a configuration for a differential amplifier.

Typically, before a power amplifier is used, a driver amplifier with two amplifier gain stages is used on the RF input signal. This arrangement requires voltage drops across at least two transistors to keep both transistors operating properly. As a result, the collector of the transistor in the second stage may have a limited voltage swing, which in turn limits the amplifier's ability to generate high, linear output power levels.

Accordingly, there remains a need for a driver amplifier that exhibits increased headroom in the amplifier to provide high, linear output power levels.

SUMMARY OF THE INVENTION

The present invention allows an input amplifier stage to couple its output power to a second gain stage through a transformer. The transformer coupling allows for the removal of a diode voltage drop at the second gain stage, thereby allowing the collector of the transistor in the second stage to have a larger voltage swing.

In particular, an RF input may be provided at the base of a first transistor and may be amplified at the collector of the first transistor. This amplified RF signal is then coupled across the transformer such that it provides an input to an emitter on a second transistor. The second transistor has a variable bias based on the amount of gain desired. The voltage level at the collector of the second transistor is free to swing between greater values, because the minimum voltage level at the emitter is not required to be sufficient to bias the first transmitter correctly.

In one embodiment, the second transistor comprises part of a second stage in which a current steering arrangement insures a well-defined minimum gain setting and good amplifier linearity over the gain control range. The second stage is configured with parallel output current paths: a gain path and a shunt path. The gain path comprises an impedance element that develops an output signal voltage in response to the amplifier's time varying output current, while the shunt path is configured to be low-impedance. A current steering circuit determines how the amplifier output current splits between the gain and shunt paths, thereby controlling amplifier gain.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

FIG. 1 schematically illustrates a prior art variable gain amplifier;

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
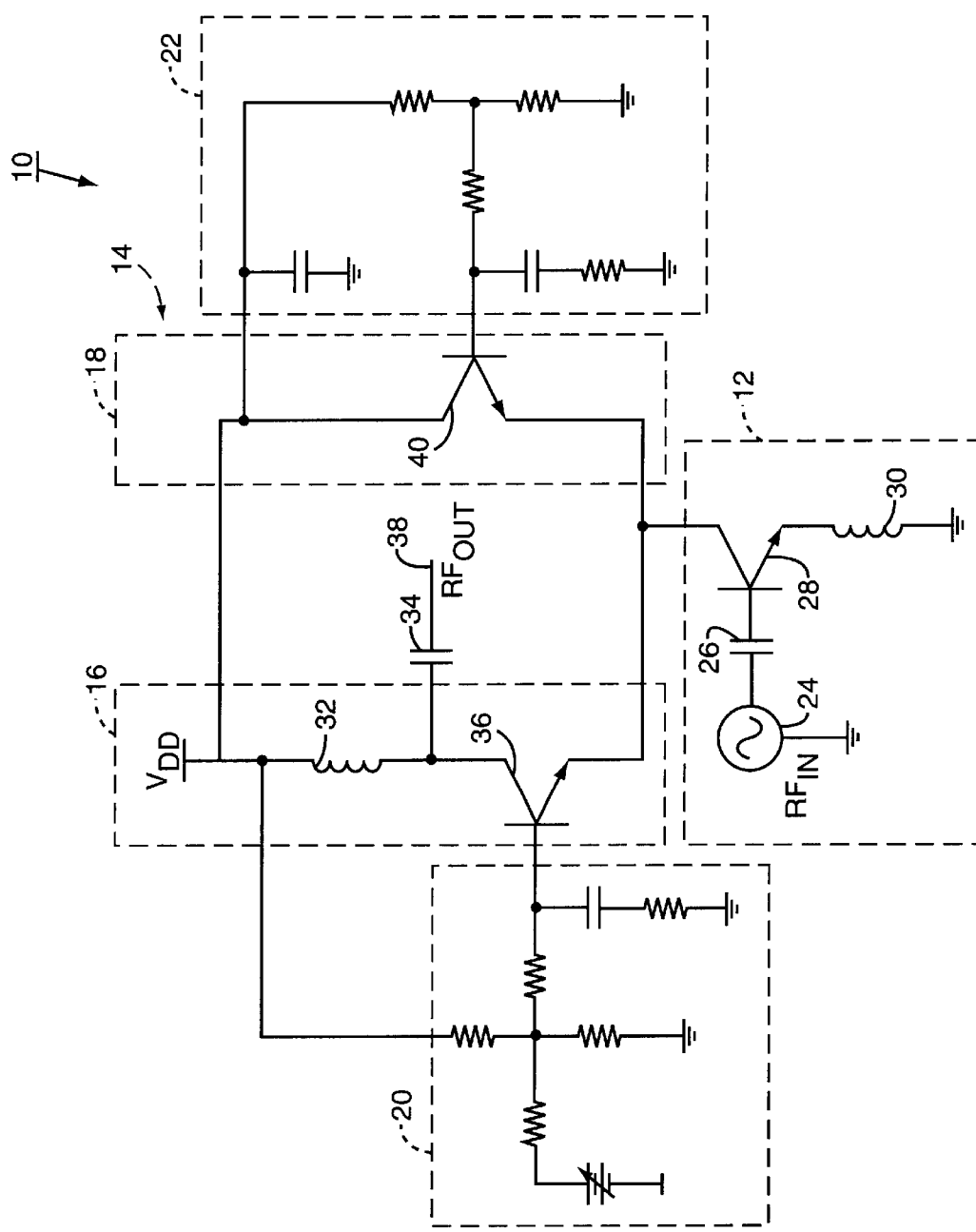

FIG. 1 illustrates a prior art variable gain amplifier circuit 10 comprised of a first stage 12, a second stage 14—which in turn comprises a gain path 16 and a shunt path 18—first variable bias circuitry 20, and fixed bias circuitry 22.

The first stage 12 comprises an RF input signal 24, a first capacitor 26, a first transistor 28, and an inductor 30, arranged substantially as shown. In operation, the RF input signal 24 is coupled through the capacitor 26 where it is applied to the base of the transistor 28 to drive the same. With proper biasing from a bias circuit (not shown explicitly), the first transistor 28 is responsive to the RF input signal 24 and provides an output current on its collector that represents an amplified version of the RF input signal 24. In the exemplary embodiment, first transistor 28 is typically a switching transistor.

The gain path 16 comprises a gain element 32 (in this case an inductor, although resistors are acceptable) and a second transistor 36. A capacitor 34 and an RF output 38 typically drive a power amplifier and an antenna (not shown). The shunt path 18 comprises a third transistor 40. The gain path 16 and shunt path 18 provide current steering with the ability to control the variable gain amplifier circuit 10. Second transistor 36 is typically operated in a linear mode up to saturation.

In use, the amplified RF signal at the collector of the first transistor 28 is steered through the second transistor 36 or the third transistor 40 based on the bias circuits 20, 22. When an output is desired at the RF output 38, the second transistor 36 is on, while the third transistor 40 off. The amplified RF signal at the collector of the second transistor 36 is then amplified again and presented to the RF output 38. When no output is desired, the amplified RF signal is shunted into the shunt path 18, which has no gain element 32, and thus, no output is present. For the variable gain amplifier circuit 10, minimum gain occurs when all the collector current the from the first transistor 28 flows through the shunt path 18, while maximum gain occurs when all of that current flows through the gain path 16.

It should be understood that between full gain and no gain is a continuum of gain possibilities. Thus, starting at no gain, all the current flows through the shunt path 18. For some small gain, most of the current flows through the shunt path 18, with some percentage of the current flowing through the gain path 16. As more gain is desired, more current flows through the gain path 16 and less through the shunt path 18 until maximum gain is reached and no current flows through the shunt path 18.

While exemplary circuitry is shown for the bias circuits 20, 22, no particular bias circuitry is required, and those of ordinary skill in the art will recognize that other bias circuits may be substituted as needed or desired.

The drawback of the arrangement illustrated in FIG. 1 is that $V_{DD}$ must be sufficiently large to provide the needed voltage drops across both the first transistor 28 and second transistor 36 to keep both transistors biased in the correct state. However, $V_{DD}$ is frequently limited by battery constraints and the like. This limits the voltage swing that can take place at the collector of the second transistor 36 and thus limits the RF output 38.

There specifically has been a need in the industry for a dual band variable driver amplifier that can obtain 12 to 15 dBm output power, 10 to 15 dB of gain, less than 4.5 dB noise figure and greater than ~30 dB of reverse isolation. This requires an output swing of 2.5 V peak to peak at the collector the second transistor 36, which is not achievable with a Gallium Arsenide (GaAs) implementation of this circuit.

The arrangement of FIG. 1 at minimum gain operation does not provide optimal operation. Theoretically, the minimum gain is zero. In practical implementations, however, the minimum gain will be non-zero and ill-defined due to semiconductor device leakages, semiconductor process variations, and other non-ideal aspects of circuit fabrication and layout.

Figure 2:
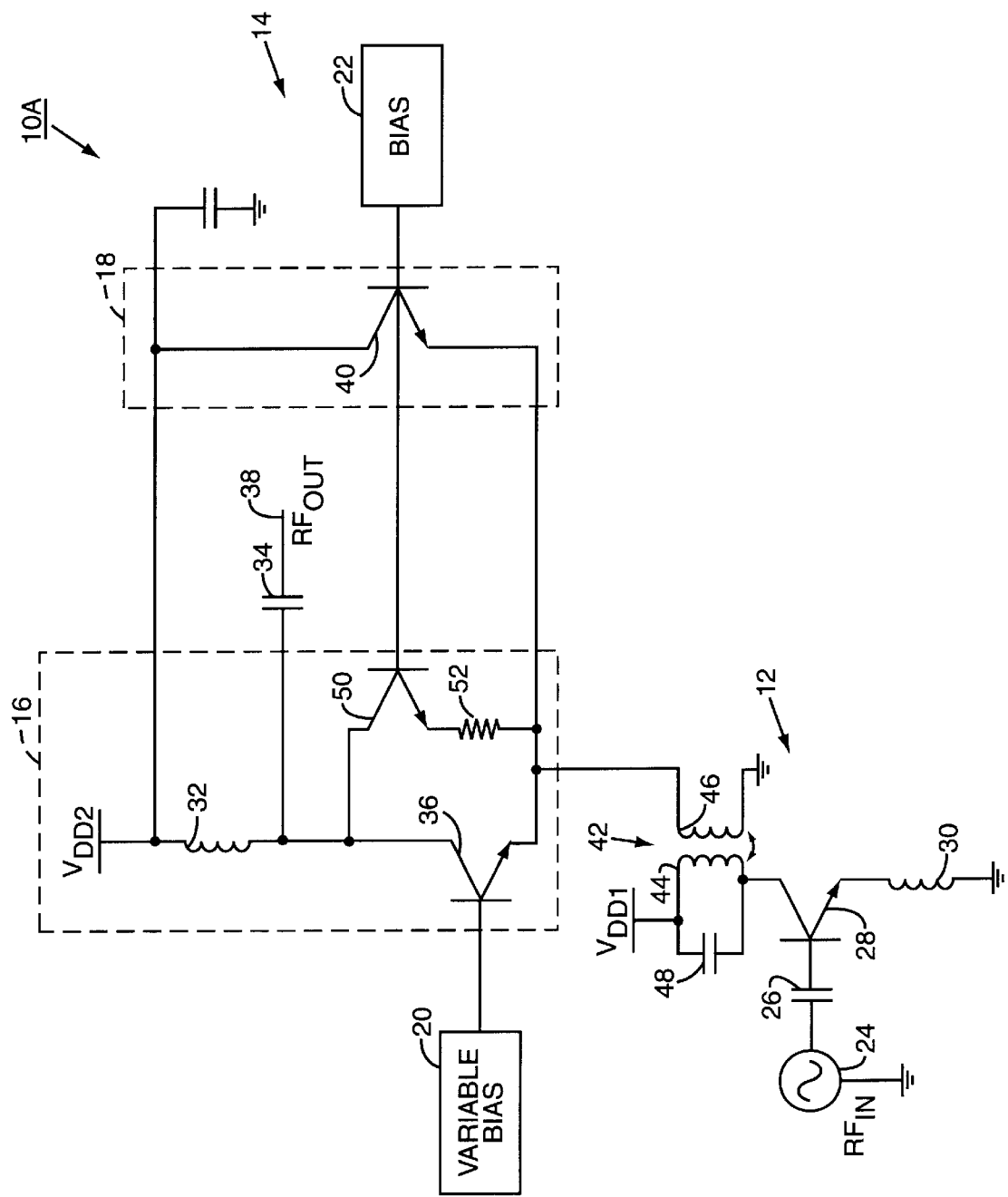
FIG. 2 illustrates a variable gain amplifier according to one embodiment of the present invention.

The present invention addresses the voltage swing shortcomings of the prior art arrangement by isolating the second transistor 36 from the voltage drop associated with the first transistor 28, as illustrated in FIG. 2. FIG. 2 illustrates a first embodiment of the present invention, namely variable gain amplifier circuit 10A, wherein like numbered elements correspond to similar or identical components illustrated in FIG. 1. The first transistor 28 is now isolated from the second transistor 36 by the introduction of a transformer 42, comprising a primary coil 44 and a secondary coil 46. The primary coil 44 may be placed in parallel with a capacitor 48. The value of the capacitor 48 determines the gain through the first stage 12. Thus, if variable gain is desired, the capacitor 48 may be replaced with a varactor (not shown). Further, for best results, the value of the capacitor 48 is chosen such that the capacitor 48 and the primary coil 44 resonate at the operative frequency in a manner providing a desired gain.

In operation, the RF signal from RF input 24 is amplified at the collector of first transistor 28 by first transistor 28. The amplified signal is then coupled from primary coil 44 to secondary coil 46 of transformer 42. The amplified signal is then available at the emitter of the second transistor 36 to drive the same. Since the bias is relatively constant at any given time, the varying voltage at the emitter of second transistor 36 controls its conductance and the amount of current flowing through the second transistor 36 from the collector to the emitter. This current causes a voltage drop across second transistor 36 to control the RF output 38. In this embodiment, the voltage swing at the collector of the second transistor 36 is not compressed by the DC voltage associated with the first transistor 28 because there is little or no DC offset associated with the secondary coil 46.

Fourth transistor 50 and a resistive element 52 are also added in this embodiment. The fourth transistor 50 is biased by bias circuit 22 and acts to stabilize the second transistor 36 at low gains, thereby solving the problematic minimum gain operation of variable gain amplifier circuit 10. Thus, conceptually, fourth transistor 50 may be thought of as being part of the shunt path 18 (for control purposes) or the gain path 16 (for effect on steering purposes). For the purposes of the present invention, the fourth transistor 50 is part of the gain path 16. For a full explanation of the operation of the second stage 14 of FIG. 2, reference is made to U.S. patent application Ser. No. 09/631,182, filed Aug. 2, 2000, commonly owned, the disclosure of which is hereby incorporated by reference. By using the disclosure of the '182 application, minimum and maximum amplifier gain may be set during the design phase based on selecting desired values for a number of well-controlled parameters, thus allowing fabrication of amplifier circuits with substantially consistent gain control performance.

In operation, the gain path 16 and shunt path 18 allow varying levels of current flow in accordance with the applied control signals from the bias circuits 20, 22 respectively. For example, at a given control voltage, the second transistor 36 may be fully on, fully off, or anywhere inbetween at an intermediate state. These states correspond to minimum impedance, maximum impedance, and continuously variable intermediate impedances, respectively. The third transistor 40 is similarly responsive to applied control voltages. In an exemplary embodiment, the applied control voltages from bias circuits 20, 22 are complementary. That is, as the current through the gain path 16 increases, the current through the shunt path 18 decreases, and vice-versa.

The fourth transistor 50 operates similarly to the second and third transistors 36, 40. The fourth transistor 50 is controlled from the shunt path 18. In this manner, the conducting state (on, off, partially on) follows that of the third transistor 40. With this configuration, a minimum gain setting where the second transistor 36 is fully off and the third transistor 40 is fully on, results in a predictable, defined value of amplifier gain. This results from the fourth transistor 50 being turned on in conjunction with the third transistor 40. At minimum amplifier gain, a small amount of current flows through the fourth transistor 50, and thus through the impedance 32 of the gain path 16, providing the needed stability.

When implemented with Gallium Arsenide (GaAs) Heterojunction-Bipolar Transistors (HBTs), desirable characteristics are achieved with the embodiment of FIG. 2. For example, the transformer 42 may have a 140 mV DC voltage at the emitter of the second transistor 36 due to the 3.5 Ω resistive loss at the secondary coil 46 for a 40 mA DC current. For a $V_{DD2}$ of 2.75 V, the collector of the second transistor 36 can swing 2*(2.75-(1.2+0.14))=2.82 V peak to peak. For a design value of +12 dBm, which requires a swing of 2.52 V peak to peak, the desired criteria are met. In contrast, the structure of FIG. 1 does not provide the needed peak-to-peak swing.

Figure 3:
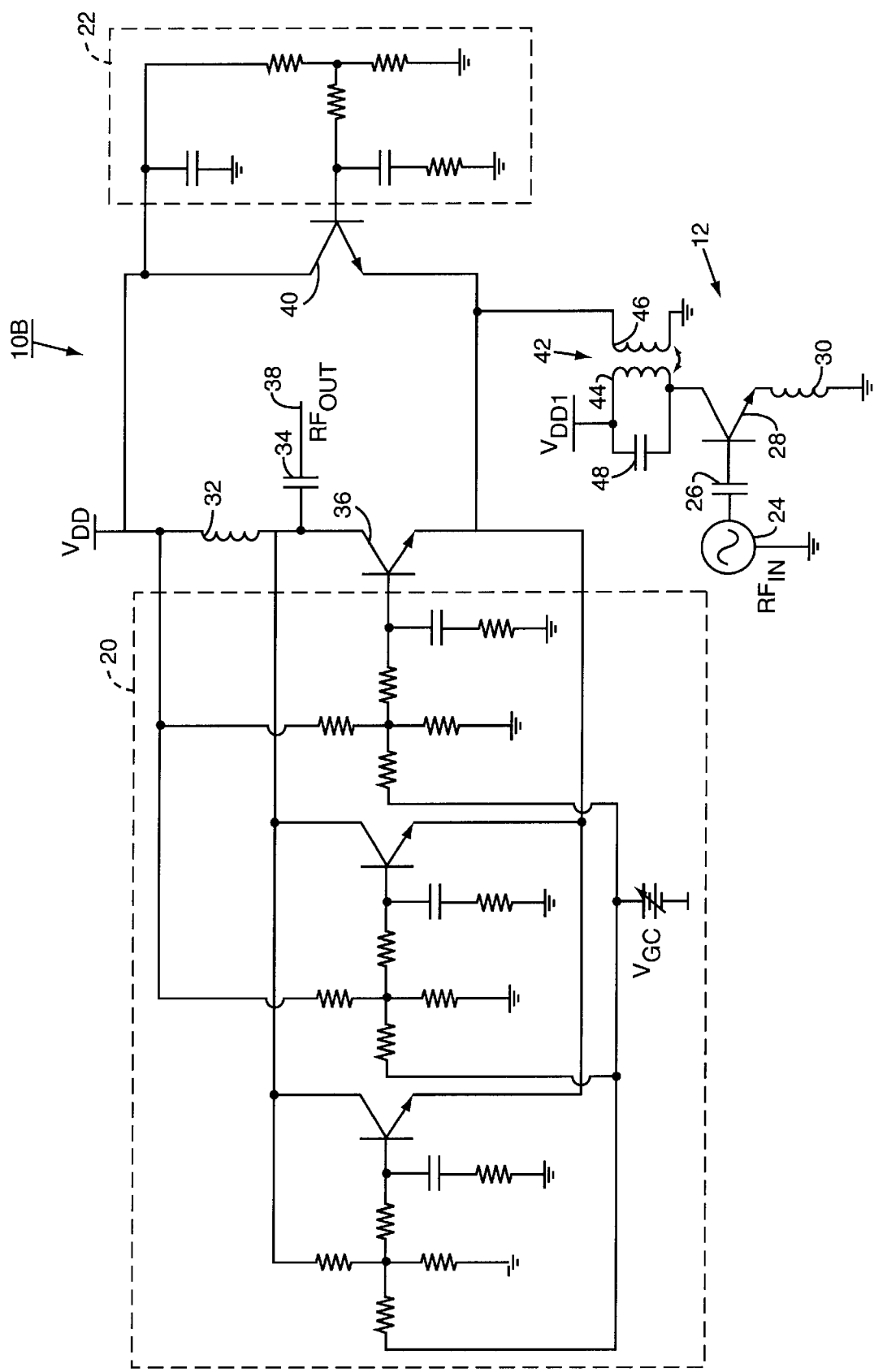
FIG. 3 illustrates a variable gain amplifier according to a second embodiment of the present invention.

The increased headroom for the desired peak-to-peak swing is achievable even in the absence of the fourth transistor 50, as illustrated by variable gain amplifier circuit 10B in FIG. 3. FIG. 3 includes an exemplary variable bias circuit 20 and fixed bias circuit 22 for completeness. Selecting values for the various components is well within the skill of those of ordinary skill in the art. Those of ordinary skill in the art will also realize that other equivalent variable bias circuits are also possible. Steering between the gain path 16 and the shunt path 18 remains the same. However, the elimination of the fourth transistor 50 introduces some minimum gain operations issues as previously discussed.

Figure 5:
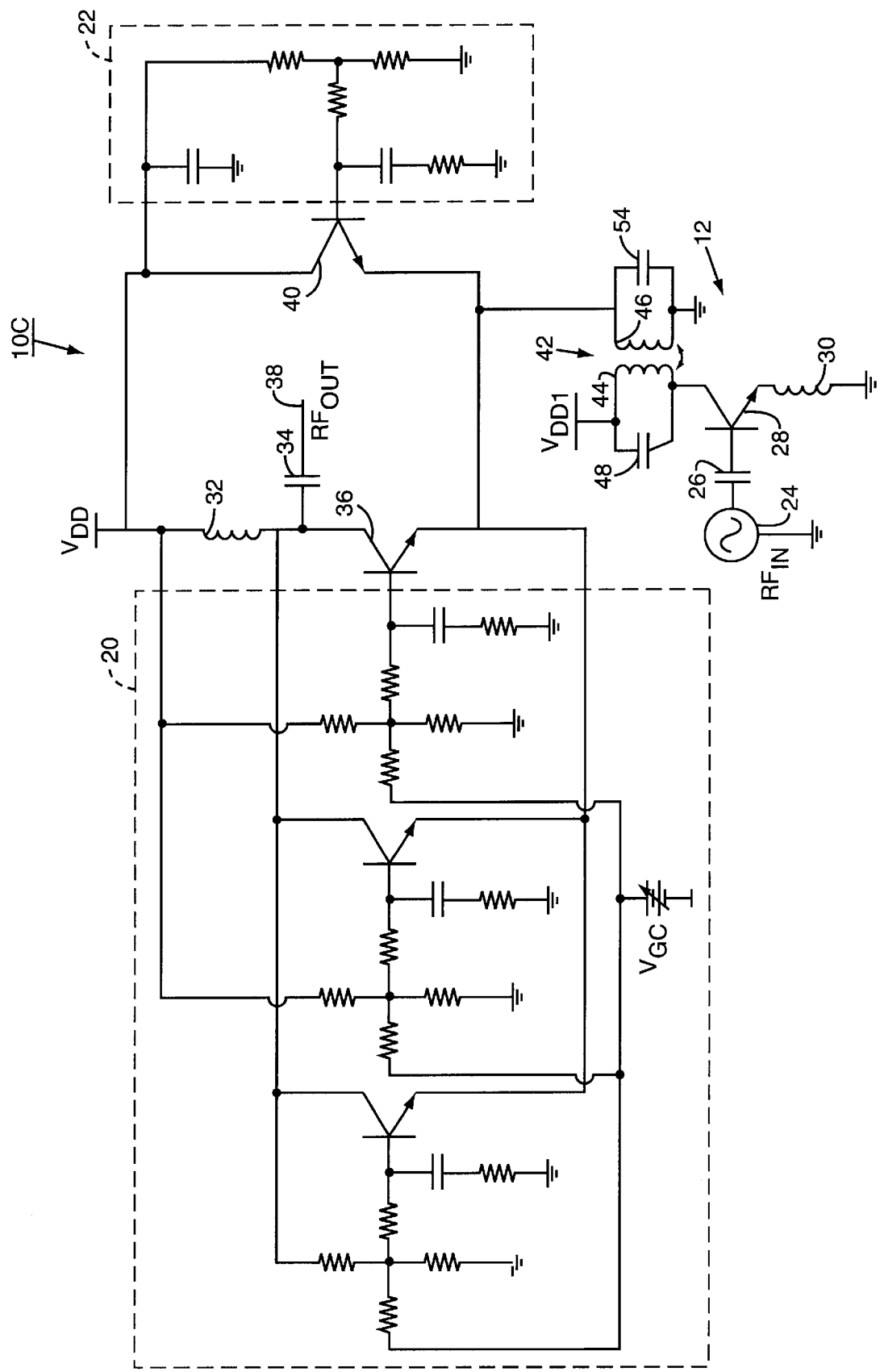
FIG. 5 illustrates a variable gain amplifier according to a third embodiment of the present invention.

Variable gain amplifier circuit 10C in FIG. 5 is substantially similar to variable gain amplifier circuit 10B of FIG. 3, but an optional capacitor 54 is added. The capacitor 54 is positioned in parallel with the secondary coil 46 and may be sized to resonate therewith at the desired frequency to provide additional gain. Like capacitor 48, capacitor 54 may be replaced with a varactor (not shown) for additional tuning capabilities.

Figure 6:
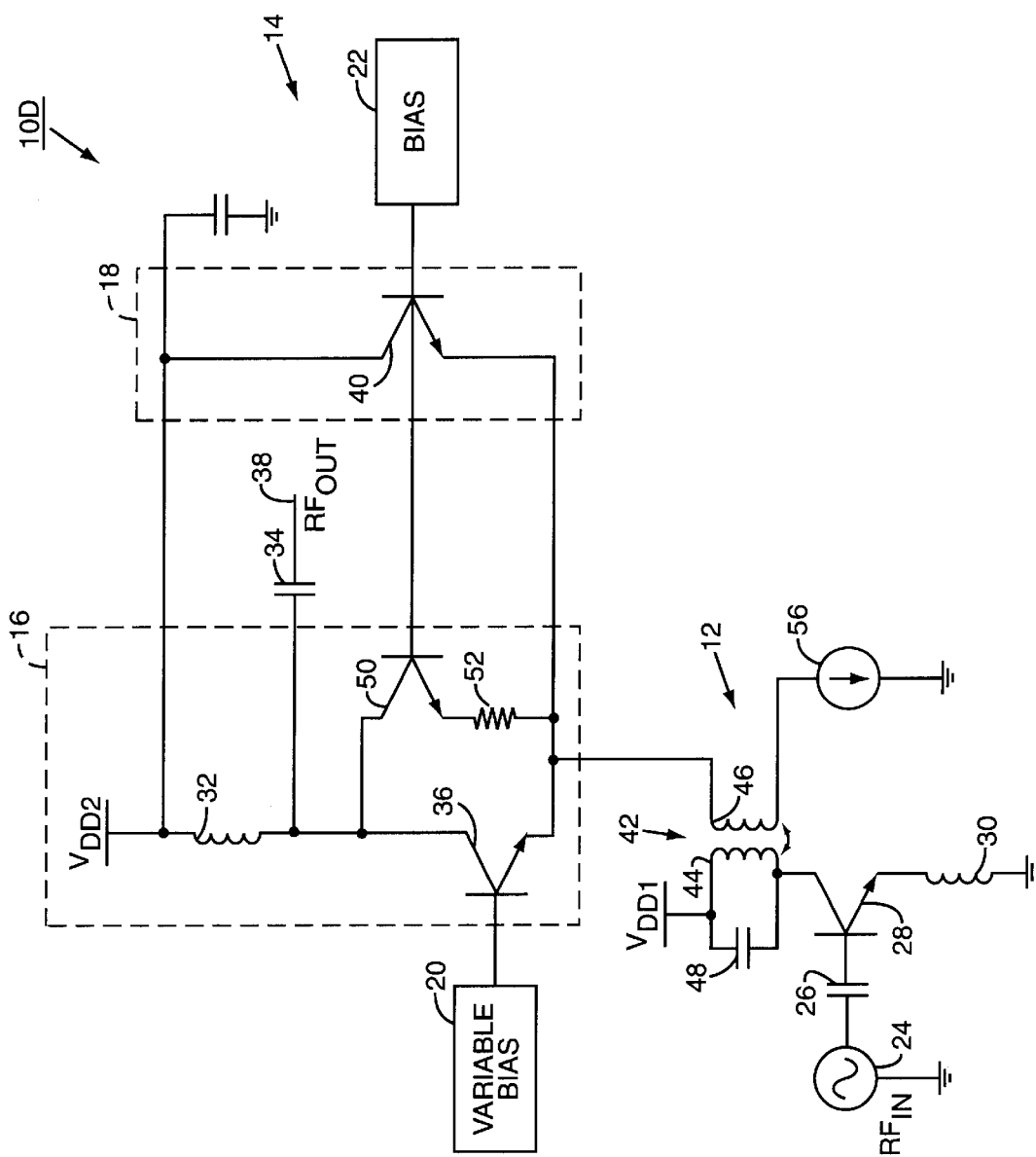
FIG. 6 illustrates a variable gain amplifier according to a fourth embodiment of the present invention.

FIG. 6 illustrates yet another embodiment, namely variable gain amplifier circuit 10D, in which a current source 56 has been added to the first stage 12. This implementation may easily be done in Silicon Germanium (SiGe). Current source 56 may be sized to control the current flow through the gain and shunt paths 16, 18.

Figure 4:
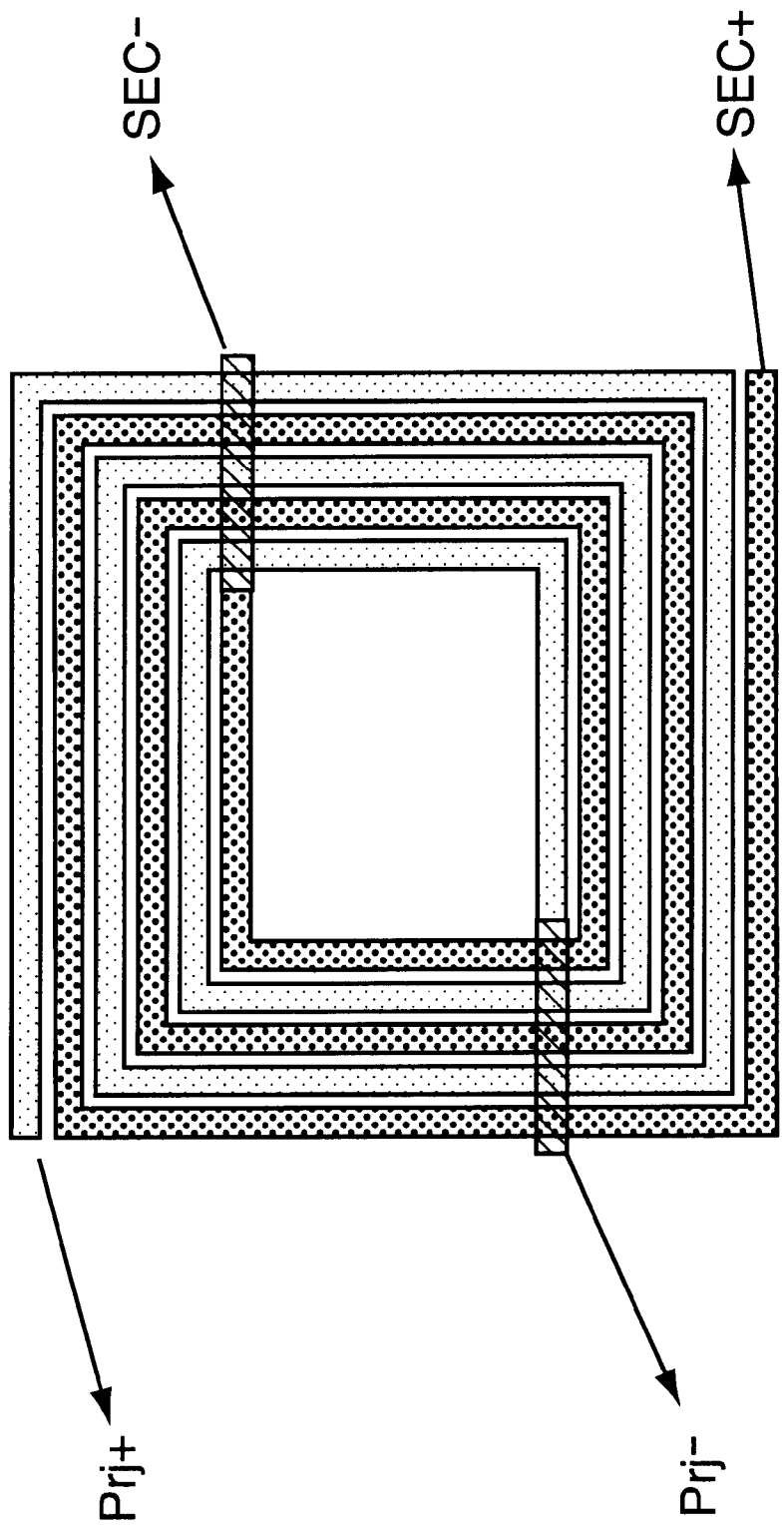
FIG. 4 illustrates a top plan view of a transformer according to one embodiment of the present invention.

Transformer 42 is illustrated in a top plan view in FIG. 4. Specifically, the coils 44 and 46 are formed by spirals of microstrip conductors placed on top of each other and separated by a dielectric (not shown). The transformer 42 can be realized in an integrated circuit. The transformer 42 is formed using two interwinding coils. FIG. 4 represents a 1:1 turn ratio transformer, so the effective turn ratio is N=1. The turn ratio is defined as N=k sqrt(L2/L1), where L1 is the inductance at the primary coil, L2 is the inductance at the secondary coil, and k is the coupling coefficient between the coil. So for an ideal coupling coefficient, k=1, the turn ratio=1. By manipulating the L1 and L2 values, a desired gain step up can be achieved. In an exemplary embodiment, the coils 44, 46 are balanced.

While the present invention has been couched in terms of a transistor with a base, an emitter, and a collector. A more generalized way of contemplating these elements of the transistor would be an input, an output, and a bias control input. The input may be the base or the emitter as needed or desired.

Those skilled in the art will recognize improvements and modifications to the preferred embodiments of the present invention. For example, many transistor technologies and types may benefit from the present invention. All such improvements and modifications are considered within the scope of the concepts disclosed herein and the claims that follow.

What is claimed is:
1. An amplifier circuit comprising:
   a first transistor comprising a base, an emitter, and a collector,
      said collector operatively connected to a voltage source via a gain element; and
      said base operatively connected to bias circuitry;
   a second transistor amplifying an RF input to provide an amplified RF input;
   a transformer comprising a primary coil and a secondary coil,
      said secondary coil operatively connected between ground and the emitter of said first transistor;
      said primary coil operatively connected to said second transistor;
      said transformer coupling the amplified RF input from said primary coil to said secondary coil to drive an emitter of said first transistor.
2. The amplifier circuit of claim 1 further comprising a primary capacitor in parallel with said primary coil, said primary capacitor controlling, in part, gain associated with said second transistor.
3. The amplifier circuit of claim 2 wherein said primary capacitor and said primary coil resonate at an operating frequency.
4. The amplifier circuit of claim 2 further comprising a secondary capacitor in parallel with said secondary coil, said secondary capacitor controlling, in part, gain associated with said second transistor.
5. The amplifier circuit of claim 4 wherein said secondary capacitor and said secondary coil resonate at an operating frequency.
6. The amplifier circuit of claim 1 further comprising a varactor positioned in parallel with said secondary coil and controlling, in part, gain associated with said second transistor.

7. The amplifier circuit of claim 1 further comprising a bias circuit operatively connected to said second transistor.

8. The amplifier circuit of claim 1 wherein said bias circuitry comprises a variable bias circuit.

9. The amplifier circuit of claim 1 further comprising a shunt path, wherein current is routed through said shunt path or said first transistor depending on desired gain control.

10. The amplifier circuit of claim 9 wherein said shunt path comprises a third transistor, said third transistor in series with an emitter load and in parallel with said first transistor.

11. The amplifier circuit of claim 10 wherein said transistor is operatively coupled to a fixed bias.

12. An amplifier circuit comprising:
   an RF input;
   a first transistor operatively connected to said RF input;
   a transformer operatively connected to a collector of said first transistor and isolating a transformer output from a voltage drop associated with said first transistor; and
   a second transistor comprising a collector, an emitter, and a base, said emitter operatively connected to said transformer output, said collector operatively connected to an RF output, and said base operatively connected to a variable bias.

13. The amplifier circuit of claim 12 wherein said second transistor comprises a portion of a gain path in an amplifier stage and further comprising a shunt path, said shunt path comprising a third transistor, said shunt path and said gain path steering current therebetween as needed to achieve a desired gain.

14. The amplifier circuit of claim 12 wherein said transformer comprises a primary coil and a secondary coil, and
   further comprising a primary capacitor positioned in parallel with said primary coil.

15. The amplifier circuit of claim 14 further comprising a secondary capacitor positioned in parallel with said secondary coil.

16. The amplifier circuit of claim 14 further comprising a varactor positioned in parallel with said secondary coil.

17. The amplifier circuit of claim 14 wherein said primary coil and said primary capacitor resonate at an operating frequency of said amplifier circuit.

18. A method of controlling an amplifier circuit comprising:
   directing an RF input signal through a first transistor to produce an amplified output;
   directing the amplified output through a transformer to isolate a transformer output from a voltage drop associated with said first transistor;
   receiving the transformer output at an emitter of a second transistor;
   amplifying the transformer output at the second transistor; and
   outputting an amplified RF output signal at a collector of said second transistor.

19. The method of claim 18 wherein directing the amplified output through a transformer comprises coupling the amplified output from a primary coil to a secondary coil.

20. The method of claim 19 wherein receiving the transformer output at the second transistor comprises receiving the transformer output from the secondary coil.

21. The method of claim 18 further comprising providing a bias to said second transistor.

22. The method of claim 21 wherein providing a bias to said second transistor comprises providing a fixed bias to said second transistor.

23. The method of claim 18 further comprising using said first transistor as a switching transistor.

24. An amplifier circuit comprising:
   a first transistor comprising an input, an output, and a control bias input,
      said output operatively connected to a voltage source via a gain element; and
      said control bias input operatively connected to bias circuitry;
   a second transistor amplifying an RF input to provide an amplified RF input;
   a transformer comprising a primary coil and a secondary coil,
      said secondary coil operatively connected between ground and the input of said first transistor;
      said primary coil operatively connected to said second transistor;
      said transformer coupling the amplified RF input from said primary coil to said secondary coil to drive an input of said second transistor.

* * * * *